5/1/84 XR 4,446,566

United States Patent [19]

Fuller

[11] 4,446,566

[45] May 1, 1984

[54] DISPERSIVE DELAY LINES

[75] Inventor: Harrison W. Fuller, Lexington, Mass.

[73] Assignee: Sanders Associates, Inc., Nashua, N.H.

[21] Appl. No.: 262,081

[22] Filed: May 11, 1981

Related U.S. Application Data

[62] Division of Ser. No. 39,230, May 14, 1979, Pat. No. 4,310,816.

[51] Int. Cl.[3] .......... H03H 7/30

[52] U.S. Cl. .......... 375/96; 324/77 H; 333/156; 455/145

[58] Field of Search .......... 375/94, 96; 455/145, 455/146, 147, 148; 324/77 B, 77 C, 77 G, 77 H, 77 R; 333/12, 23, 156-164, 243, 245; 307/510, 511; 370/100

[56] References Cited

U.S. PATENT DOCUMENTS

| | | | |
|---|---|---|---|
| 2,954,465 | 9/1960 | White | 455/147 |
| 4,247,939 | 1/1981 | Stromswold et al. | 375/1 |
| 4,302,838 | 11/1981 | Eng et al. | 370/100 |
| 4,305,159 | 12/1981 | Stromswold et al. | 455/148 |

*Primary Examiner*—Jin F. Ng
*Assistant Examiner*—Stephen Chin
*Attorney, Agent, or Firm*—Louis Etlinger; Donald A. Streck

[57] ABSTRACT

Improvements to dispersive delay lines are provided which involve bifurcation to provide for low insertion loss and a non-dispersive/dispersive delay line which allows for non-simultaneous input/output operation, and removes input/output leakage as a limitation to dynamic range.

3 Claims, 15 Drawing Figures

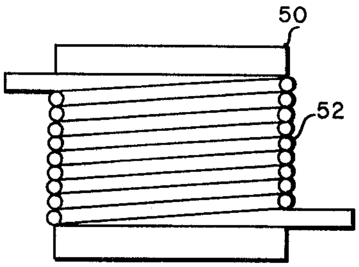
FIG. 4
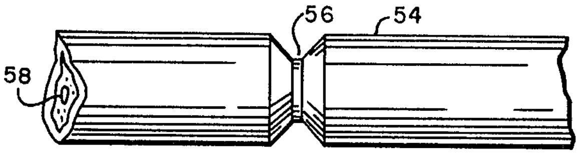
FIG. 5
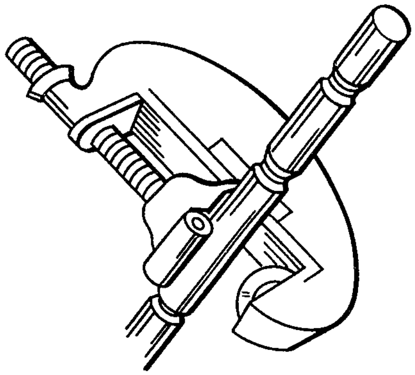
TUBE CUTTING TOOL
FIG. 8
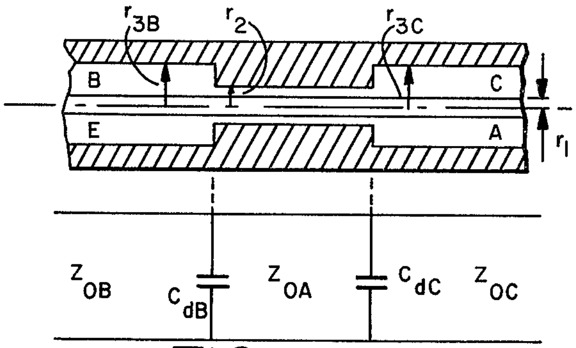
FIG. 6
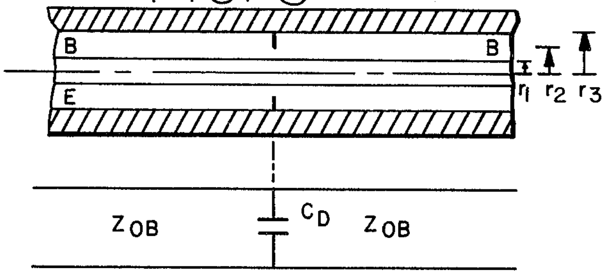
FIG. 6A
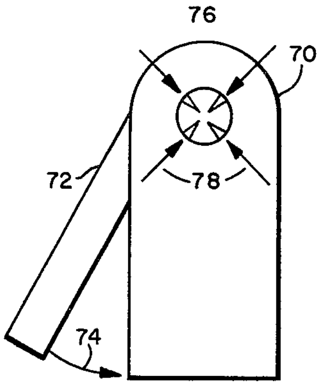
FIG. 9
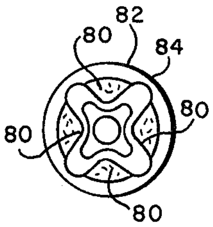
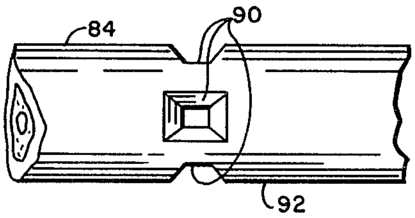
FIG. 10A FIG. 10B

DISPERSIVE DELAY LINES

This is a division of application Ser. No. 06/039,230, filed May 14, 1979, now U.S. Pat. No. 4,310,816.

FIELD OF INVENTION

This invention relates to dispersive delay lines and/or bandpass filters and more particularly to improvements to broadband dispersive delay lines or bandpass filters, involving minimizing insertion loss and increasing dynamic range.

BACKGROUND OF INVENTION

This invention relates to performance improvements which may be achieved in many types of dispersive delay lines. Since the improvements were initially designed for a special type crimped coax line, this type line will be discussed in detail so as to enable understanding of the benefits achieved. However, it will be understood that the subject techniques are applicable to other delay lines and especially to those in which there are considerable transmission losses.

Dispersive delay lines have been utilized in the past for many purposes such as compression filters which compress signals by making the delay of the signal applied to the line proportional to frequency or alternatively, as a chirp local oscillator which generates an output signal whose frequency rapidly sweeps through a given band. One of the most popular uses for the dispersive delay line is in compressive receivers, in which the presence and frequency of an incoming signal is ascertained by heterodyning the incoming signal with a fast-sweeping variable frequency oscillator signal. The dispersive delay line compresses the resulting signal and its output when sampled at a particular time shows the existence of a signal at a predetermined frequency.

For purposes of this invention a dispersive delay line is a network arranged so that signals at the low end of a given band are delayed $\tau_1$ seconds, and the signals at the high end of the band are delayed $\tau_2$ seconds, with a linear relationship in between:

$$\frac{\tau - \tau_1}{\tau_2 - \tau_1} = k\frac{f - f_L}{f_U - f_L}$$

The result is that for a frequency sweep matched to the frequency is delay characteristic of the line, the low frequency part of the signal emerges from the network simultaneously with the high frequency part, and indeed all frequency components of a signal emerge simultaneously.

In the past, there have been a number of different dispersive delay line techniques. One delay line is called a "meander line" and was developed and used by the Stanford Research Institute in their pioneering microscan receiver developements for the U.S. Air Force and U.S. Army. The meander line was a delay line consisting of bridged T microwave sections which were planar in structure. While excellent early results were obtained with the meander line, which included a 600 MHz bandwidth and a 200 nanosecond differential delay, this particular type of line is difficult to fabricate and expensive to manufacture.

More recently, surface acoustic wave (SAW) devices have been utilized in pulse-compression. In 1976, R. D. Weglein et al, of Hughes, reported a 500 MHz bandwidth surface wave pulse compressive filter operating about a center frequency of 1.3 GHz, mellon and Bell of Texas Instruments described the development of a UHF surface wave pulse compressor, which device was designed to operate between 1.0 and 1.5 GHz. Also in the same year, Williamson et al presented a paper on "L-Band Reflective Array Compressor with a Compression Ratio of 5120." Weglein's line used electron beam fabrication as did that of Mellon and Bell. Williamson's line was a reflective array compressor utilizing ion beam etching for pattern generation.

In most instances, the reflective array compressor lines are fabricated on lithium niobate and BGO. Here, the bandwidth is resolution limited at about 500 MHz.

Limits of high frequency operation of SAW devices, whether they use interdigitated finger patterns, reflective grooves, or combinations of these, depends upon the ability to accurately produce the pattern to be manufactured on the required substrate. At the present time, SAW State-of-the-Art technology appears to be progressing towards a practical 1 GHz bandwidth filter.

One family of dispersive delay lines not heretofore mentioned, are the magnetostatic wave delay lines. The principle of operation of these delay lines depends on continuous, inherent dispersive properties of the delay medium that potentially eliminates the need for high resolution transducer patterns. At the same time, the propagation velocity is low enough to design small devices. Both magnetostatic surface wave results and bulk wave results show promise of very high frequency operation from several GHz to tens of GHz. However, these particular lines have excessive insertion loss and an excessive latency time for purposes of high performance pulse compression receivers.

As compared to the State-of-the-Art compressive filters, a compressive filter can by the present teaching be fabricated from a simple conventional "semi-rigid" 50 ohm coaxial cable, in which the cable is provided with discontinuities at predetermined spaced intervals, which discontinuities reflect energy of a pedetermined frequency back through the line by virtue of the spacing between the discontinuities. In one embodiment this is accomplished by a technique in which the outer conductor is crimped inwardly at selected points to provide a single port device which has a wider bandwidth than the SAW devices with lower insertion loss. When the axial crimp length is small compared to the wavelength, the crimped portion behaves as a simple capacitive shunt to reflect incoming energy back down the line, selectively by frequency as a function of crimp spacings. For purposes of this invention "crimping" refers to the compressing or pinching of the outer conductor of the coaxial line towards the inner conductor. In conventional "semi-rigid" coaxial lines the outer conductor is copper or steel.

At the present time, with the crimp coax technique, it is possible to obtain a demonstrable pulse compression bandwidth of up to 3.6 GHz and low insertion loss in a single line. Other features are a single port, 50 ohm impedance and insensivity to temperature changes, and further automatic temperature compensation by forming the linear-FM swept local oscillator by impulsing a crimped line of similar design. The crimping is accomplished by a crimping tool which in one embodiment has four teeth which squeeze into the line to provide the capacitative shunt. Alternatively, the line may be compressed at the required point by parallel spaced apart blades in a scissors-like pinch action, or by a pipe-cutting type tool which crimps the line symmetrically into an annular groove.

The crimped coax dispersive delay line is a single port device which may be easily and inexpensively mass produced with a pecisely controlled characteristic impedance of 50 ohms thus requiring no matching networks, and with a low temperature coefficient of delay which eliminates the need for temperature control. Independent crimping for amplitude weighting and linear time delay corrections is accomplished within the line and the compact structure needs no shielding or special packaging.

It should be noted that the use of a coaxial cable as a delay line is not without precedent. The simple, reliable wideband "uncrimped" coaxial cable delay line has been in use for over twenty years in many thousands of repeater jammers as a microwave memory element. No other device (bulk acoustic, SAW or meander line) has proven as economical in this application when large bandwidth and low loss are required.

As is well known, coaxial cable has a certain amount of transmission loss associated with it, which losses acccumulate when long lines are used.

Although the crimped coax configuration described functions completely satisfactorily for most applications it is possible to improve its performance.

In general, it is possible to increase the bandwidth of a dispersive delay line by lowering transmission loss through the use of two pulse compression lines or a bifurcated line. Propagation loss is, in effect, eliminated by bifurcating the line at the centrally located midpoint and feeding the two halves simultaneously, one with an upswept signal and the other with a downswept signal. Use of a composite non-dispersive/dispersive delay line in another configuration allows for non-simultaneous input/output operation and removes input/output leakage as a limitation to dynamic range. This is called the "high dynamic range" embodiment. It should be noted that certain dispersive delay lines inherently have non-dispersive characteristics, but this factor has not heretofore been used in a system to increase the dynamic range of the line. Moreover, it will be appreciated that delay lines may be used in one or both of two modes: (1) as a compressive filter for use with compessive receivers and (2) as a chirp local oscillator which, when fed with a short impulse signal effectively having all frequency components, produces sequentially signals differing in frequency so as to provide a sweep or chip local oscillator signal at its output.

It will be appreciated that the above improvements have been described in terms of a dispersive delay line in which the delay is a linear function of frequency. The crimped coaxial line may also be configured to function as a bandpass filter. In one embodiment, with equally spaced crimps, the filter has a sin x/x characteristic. Alternatively, with appropriate amplitude and phase weighting, the line can be tailored to a desired bandpass characteristic involving a predetermined sidelobe structure. It will be appreciated that the amplitude weighting is a function of the depth of the crimp, and the phase is a function of crimp positioning. It should be noted that bandpass filters have been made in the past from waveguides provided with spaced stubs. This is however an expensive process and the crimped coaxial line offers significant cost advantages as well as certain performance advantages. Also due to the flexibility of the crimped coaxial line, packaging dimensions can be minimized with the coiling of the lines.

It is therefore an object of this invention to provide increased bandwidth for either dispersive delay lines or bandpass filters through the use of either two delay lines, a bifurcated line having a single port, or a fraction of a bifurcated line with heterodyning circuitry.

It is also an object to provide a high dynamic range delay line configuration.

These and other objects will be better understood when viewed in light of the following description taken in conjunction with the following drawings:

BRIEF DESCRIPTION OF THE DRAWINGS

FIG. 4 is a plan view of a crimped coax delay line coiled about a spool;

FIG. 5 is a plan view of a portion of a crimped coaxial cable which is annularly crimped;

FIGS. 6A and 6B illustrate the capacity shunt provided by the discontinuity involved in the crimping process, first a fairly long sized crimp and then illustrating a fairly short sized crimp:

FIG. 8 shows a tube cutting tool which is used to provide the crimp in the coaxial line of FIG. 5;

FIG. 9 is a diagrammatic representation of a four-tooth crimping tool which provides for capacitive shunt discontinuities in a conventional coaxial cable;

FIGS. 10A and 10B show respectively in cross section and plan view the result of the utilization of the crimping tool of FIG. 9;

DETAILED DESCRIPTION

Figure 1:
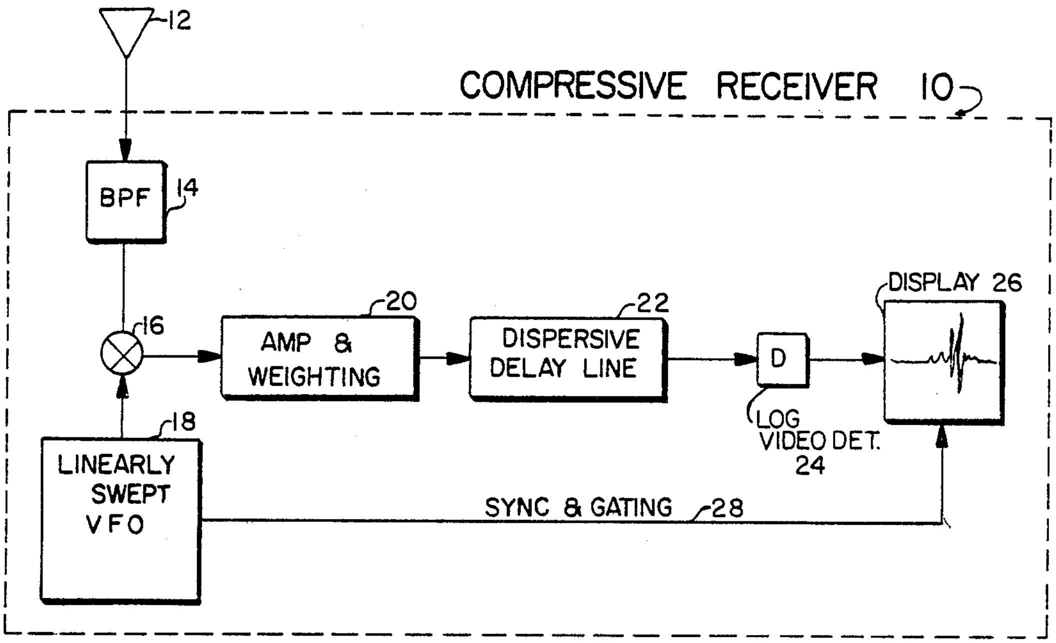
FIG. 1 is a diagrammatic representation of a conventional compressive receiver utilizing a dispersive delay line.

Since the dispersive delay lines are most popularly utilized in compressive receivers, a conventional compressive receiver is now described. Conventional compressive receivers such as that illustrated in FIG. 1 by reference character 10, in general comprise an antenna 12 which is coupled to a bandpass filter 14 which is in turn coupled to mixer 16 which mixes a linearly swept, variable frequency oscillator 18 signal with the incoming signal. This results in a heterodyned signal which is applied to a conventional amplitude spectral weighting circuit 20, the output of which is applied to a dispersive delay line 22. The purpose of the spectral weighting circuit is to time compress the input signal. The output signal of the dispersive delay line is under ordinary circumstances detected by a linear or log video detector 24 and is displayed conventionally on a CRT or other type display 26, such that with appropriate synchronization and gating pulses applied on line 28, the existence and frequency of an incoming signal may be determined.

As will be appreciated, the compressive receiver is utilized to simultaneously scan a band of incoming signals and to determine the existence or presence of an incoming signal of a given frequency, or multiple incoming signals of different frequency. The larger the bandwidth of the dispersive delay line, the larger the band that the compressive receiver can sweep, and therefore, the more useful the compressive receiver in terms of detecting incoming signals. Conversely, if the band which is swept is kept the same, the higher the bandwidth of the dispersive delay line, the more information which can be obtained by increased resolution of each "frequency bin". Thus, the bandwidth of the dispersive delay line plays a crucial role in the operation of the compressive receiver and its ability to operate either at higher and higher resolution or concomitantly with faster sweeping local oscillators. Of more basic importance is the "time bandwidth product" which is roughly equal to the reciprocal of the fractional resolution.

As mentioned hereinbefore, SAW devices have been utilized traditionally as the dispersive delay line element. When used in a compressive receiver, the dispersive delay line acts as a compressive filter. However, it should be noted that the dispersive delay line may act in the manner of a swept local oscillator or chirped local oscillator by merely applying a short impulse to the input thereof.

Figure 2:
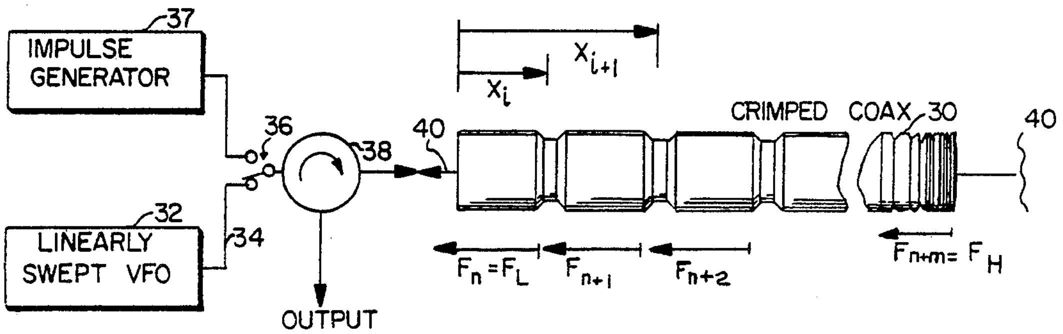
FIG. 2 is a diagrammatic representation of a dispersive delay line formed from the crimping of conventional, "semi-rigid" coaxial cable.

The subject invention, as illustrated in FIG. 2, shows the utilization of a conventional semi-rigid coaxial cable 30 which may be type UT-141, sometimes known as microcoax. The coax may have a solid outer conductor, teflon insulation and either a copper or copper coated steel inner conductor. The coax length may extend for as much as 70 feet and is therefore usually coiled and potted after the crimping, to be described hereinafter. As illustrated in FIG. 2, in the compressive filter mode, a swept frequency signal generator 32 such as described in U.S. Pat. No. 3,382,460 issued to D. Blitz et al on May 7, 1968, has an output 34 applied through switch 36 to a directional circulator 38 and thence to the input port 40 of the crimped coax line 30. Alternatively, in a chirp local oscillator (LO) mode, an impulse generator 37 using for example a step recovery diode such as Hewlett Packard HP 5082-0802 in conjunction with a $\lambda/4$ stub, is coupled via switch 36 to the directional coupler. This device is designed to generate a single sinusoid at the center frequency of the compressive line. The output in this mode is a linear-swept FM sinusoid starting at $f_L$ and rising linearly to $f_U$ in one line roundtrip time.

As can be seen, the crimped coax line is terminated conventionally at 42, with crimps designated $f_n$, $f_{n+1}$, $f_{n+2} \ldots f_{n+m}$ denoting the region at which signals at these frequencies are primarily reflected back through the crimped coaxial line.

Figure 3:
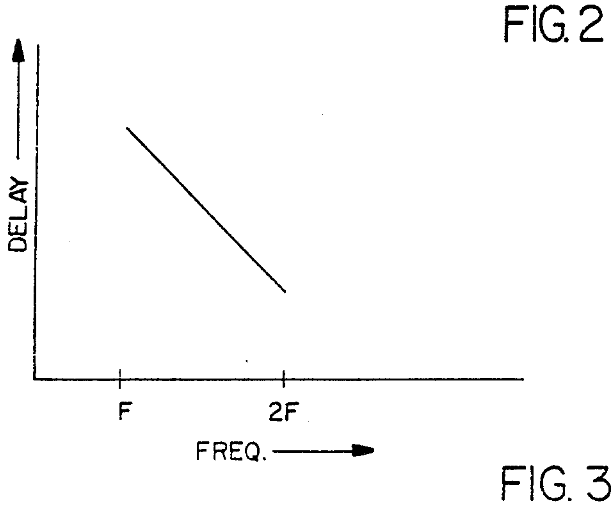
FIG. 3 is a diagram showing delay as a function of frequency for the delay line of FIG. 2, in which the line operates over a frequency band of less than an octave.

It will be appreciated that due to the nature of capacitive shunts within a localized region of the line, it takes a number of equally spaced crimps to reflect energy back at a given frequency. These crimps can be conceived of as a subset of the crimps illustrated, in that the average spacing in this small section of line is the correct spacing for the particular frequency denoted by the characters $f_n$, $f_{n+1}$, etc. The notation in FIG. 2 is therefore merely a schematic representation on a macroscopic level of the function of the line. In the illustrated case, the low frequency end of the coax is at the lefthand end and the high frequency end of the coax is at the righthand end, as designated by $f_L$ and $f_H$. The delay versus frequency of the coax line is linear as illustrated by FIG. 3 and the placement of the crimps, in one embodiment, is dictated by the following generalized formula:

Starting at the low-frequency end of the line, the recurrence relationship used in calculating crimp position is:

$$x_{i+1} = x_i + \frac{Kc/2f_L}{1 + x_i\left(\frac{f_H - f_L}{f_L L}\right)}$$

Where c is the speed of light; $x_i$ is a reflector position along a line; K is the fractional velocity $\epsilon^{-\frac{1}{2}}$ caused by a coax dielectric medium of dielectric constant $\epsilon=2$; and L is the total length of the line.

The frequency of the signal reflected in the region of a given crimp is given by:

$$f(x)=x/L\,(f_H-f_L)-f_L$$

As illustrated in FIG. 4, once the coaxial line has been crimped at the appropriate places, it may be wound on a spool 50 so as to accomodate the long length of line required for the dispersive delay. In this case, the line is illustrated as being helically coiled at 52 although the line may be coiled on itself in a single plane (not shown). The benefit of the flat coil configuration is that a number of lines, both compression and chirp, can be packaged together and maintained at the same temperature to maintain matched compression and chirp characteristics.

An annular crimped portion of the coax is shown in FIG. 5 in which the outer conductor 54 is crimped inwardly as shown at 56 towards the central conductor 58, a portion of which is shown. This may be accomplished by a conventional rolling-wheel tube cutter 60 shown in FIG. 8 having a wheel edge rounded to a 10 mil radius of curvature. The equivalent circuits for an idealized coaxial line discontinuity are shown in FIGS. 6A and 6B and which indicate that assuming a crimped discontinuity which is axially sufficiently short, discontinuities behave like a simple shunt capacity as shown at the bottom of FIG. 6B. It can be shown that $C_{dB}$ is approximately equal to: $2\pi r_1 \epsilon C'_{d2}(a/b, r_{3B}/r_1)$ and that $C_{dC}$ is approximately equal to $2\pi r_1 \epsilon C'_{d2}(a/c, r_{3C}/r_1)$, where a is equal to $r_2-r_1$, b is equal to $r_{3B}-r_1$ and c is equal to $r_{3C}-r_1$. Here $C'_{d2}$ is the discontinuity capacitance divided by inner circumference as described in the Proceedings of the IRE, November 1944, p. 695 at p. 699, entitled Coaxial-Line Discontinuities by Whinnery, Jamieson and Robbins, incorporated herein by reference.

By recognizing that the discontinuity is axially short, the capacitance $C_d$ is approximately equal to $4\pi r_1 \epsilon C'_{d2}(a/b, r_3 r_1)$ where a is equal to $r_2-r_1$; b is equal to $r_3-r_1$. $C'_{d2}$ can be determined by the graph of FIG.

10 of the above-identified article at page 699. Knowing this, it is a simple matter to calculate the placement and depth of the crimp.

LIGHT, MEDIUM AND HEAVY CRIMPS

In one embodiment $C_d$ equaled 0.00474 $\mu\mu$fd for a light crimp. It will be apparent that some axial elongation occurs during heavy crimping and demands that this elongation be considered in the crimp distribution for a precision line design. A second-order amplitude and phase correction is available by very light crimps placed between initial crimps for fine tuning amplitude and phase corrections of the measured line. The elongation effects of these light crimps can be ignored. Amplitude corrections are made midway between the heavy crimps to produce a 180° phase reflection, thus affecting amplitude and not phase. Phase corrections that leave amplitude response undisturbed are made at $\frac{1}{4}$ or $\frac{3}{4}$ positions between crimps, depending on whether a positive or negative phase correction is required.

The capacity of a heavy shunt can be calculated by scaling the three radii to the 85 mil outer diameter of the line such that $r_1=10.6$ mils; $\bar{r}_2=16.8$ mils and $r_3=31.9$ mils. From the above equations, $a=6.2$ mils, $b=21.3$ mils, $a/b=0.291$ and $r_3/r_1=3.01$. $C_d$ therefore $=0.036$ $\mu\mu$fd where $\epsilon=2$ is assumed for a Teflon insulation. $\bar{r}$ refers to mean effective radius.

If a design center frequency of 6 GHz is chosen a shunt capacity of 0.036 $\mu\mu$fd has a reactance of $|X_c(6.0)| \doteq |i/(2\pi fC_d)| = 736$ ohms. The reflection coefficient of such a reflector in a 50 ohm line is roughly 0.068 with a phase shift of 87.7 degrees in a nine crimp line quency shift of the structure is 0.021 fractionally, for a frequency factor of 0.979. The theoretically corrected center frequency for the line is thus $f_c=5.83$ GHz in one embodiment. The peak response insertion loss in one experimental embodiment was 4.5 db, which was well within experimental error.

While the response of the 9-reflector filter should be approximately sin x/x in form, it is clear that the high frequency sidelobe exceeds the low. This asymmetry results from two 6 dB per octave effects: the linear increase in (small) reflection coefficient (for a capacitive shunt) with frequency, and the number of reflectors per incremental frequency interval that increases linearly with frequency. From both theoretical and experimentally confirmed results, reflection capacity of 0.036 $\mu\mu$fd can be utilized for the deep crimp situation. The same analysis yields capacities for the medium and light crimps such that for the medium crimp $r_1=10.6$ mils, $\bar{r}_2=23.3$ mils, $r_3=31.9$ mils, $a=10.7$ mils, $b=21.3$ mils, $a/b=0.502$, $r_3/r_1=3.01$.

The capacity for the light crimp is found from $r_1=10.6$ mils, $\bar{r}_2=26.6$ mils, $r_3=31.9$ mils, $a=16.0$ mils, $b=21.3$ mils, $a/b=0.751$, $r_3/r_1=3.01$, $C_d=4\pi r_1\epsilon C'_{d2(a,r)}=0.00474$ $\mu\mu$fd.

It is therefore straightforward to achieve a ten-to-one range of crimp reflection coefficients which is sufficient to permit building amplitude weighting directly into the line.

In one operative example, the crimp locations for an experimental line having a 6.0 GHz center frequency and 3.6 HGz bandwidth are given in Table I hereinbelow:

TABLE 1

Figure 7A:
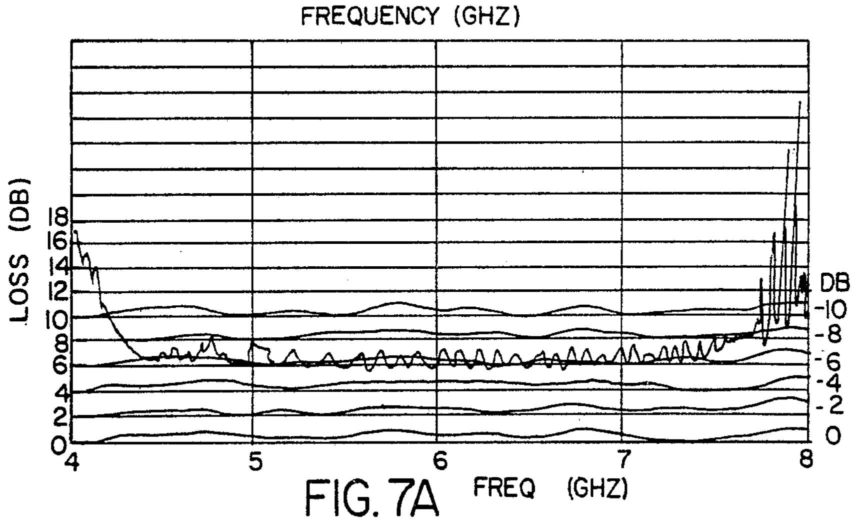
FIGS. 7A and 7B show expanded results of one crimped coax line in terms of amplitude and phase response.

| i | $x_i$ (Inches) | $x_i-x_{i-1}$ (Inches) | i | $x_i$ (Inches) | $x_i-x_{i-1}$ (Inches) | i | $x_i$ (Inches) | $x_i-x_{i-1}$ (Inches) |
|---|---|---|---|---|---|---|---|---|
| 0 | 0 | — | 32 | 26.87099925 | 0.7313713488 | 64 | 47.99814039 | 0.604988552 |
| 1 | 0.9842519686 | 0.9842519686 | 33 | 27.59715055 | 0.7261512957 | 65 | 48.60016764 | 0.6020272526 |
| 2 | 1.955854445 | 0.971602476 | 34 | 28.31819225 | 0.7210416999 | 66 | 49.19927673 | 0.5991090856 |
| 3 | 2.915284902 | 0.9594304572 | 35 | 29.03423097 | 0.7160387152 | 67 | 49.79550974 | 0.596233014 |
| 4 | 3.86299144 | 0.9477065379 | 36 | 29.74536965 | 0.7111386798 | 68 | 50.38890777 | 0.5933980336 |
| 5 | 4.799395262 | 0.9364038217 | 37 | 30.45170776 | 0.7063381059 | 69 | 50.97951094 | 0.5906031744 |
| 6 | 5.724892881 | 0.9254976185 | 38 | 31.5334143 | 0.7016336695 | 70 | 51.56735844 | 0.5878474987 |
| 7 | 6.639858106 | 0.9149652246 | 39 | 31.85036363 | 0.6970221995 | 71 | 52.15248854 | 0.5851300978 |
| 8 | 7.544643821 | 0.9047857149 | 40 | 32.5428643 | 0.6925006706 | 72 | 52.73493863 | 0.5824500931 |
| 9 | 8.439583596 | 0.8949397748 | 41 | 33.23093049 | 0.6880661922 | 73 | 53.31474526 | 0.5798066348 |
| 10 | 9.324993134 | 0.8854095379 | 42 | 33.91464649 | 0.6837160036 | 74 | 53.89194416 | 0.5771988977 |
| 11 | 10.20117158 | 0.876178450 | 43 | 34.59409395 | 0.6794474644 | 75 | 54.46657024 | 0.5746260848 |
| 12 | 11.06840273 | 0.8672311515 | 44 | 35.2693520 | 0.6752580491 | 76 | 55.03865766 | 0.5720874223 |
| 13 | 11.9269561 | 0.8585533656 | 45 | 35.94049734 | 0.6711453394 | 77 | 55.60823982 | 0.5695821605 |
| 14 | 12.7770879 | 0.8501318017 | 46 | 36.60760436 | 0.6671070209 | 78 | 56.17534939 | 0.5671095735 |
| 15 | 13.61904197 | 0.8419540702 | 47 | 37.27074523 | 0.6631408744 | 79 | 56.74001835 | 0.5646689552 |
| 16 | 14.45305058 | 0.8340086065 | 48 | 37.92999000 | 0.6592447734 | 80 | 57.30227797 | 0.5622596235 |
| 17 | 15.27933518 | 0.8262845996 | 49 | 38.58540668 | 0.655416678 | 81 | 57.86215888 | 0.5598809143 |
| 18 | 16.09810711 | 0.8187719317 | 50 | 39.23706131 | 0.6516546297 | 82 | 58.41969106 | 0.557532184 |
| 19 | 16.90956823 | 0.8114611217 | 51 | 39.88501806 | 0.6479567488 | 83 | 58.97490387 | 0.555212807 |
| 20 | 17.7139115 | 0.8043432729 | 52 | 40.52933929 | 0.6443212301 | 84 | 59.52782605 | 0.5529221777 |
| 21 | 18.51132153 | 0.7974100288 | 53 | 41.17008563 | 0.6407463381 | 85 | 60.07848576 | 0.5506597053 |
| 22 | 19.30197506 | 0.7906535328 | 54 | 41.80731603 | 0.637230406 | 86 | 60.62691058 | 0.5484248185 |
| 23 | 20.08604145 | 0.7840663885 | 55 | 42.44108785 | 0.6337718243 | 87 | 61.17312754 | 0.5462169595 |
| 24 | 20.86368308 | 0.7776416262 | 56 | 43.0714569 | 0.603690538 | 88 | 61.71716313 | 0.5440355884 |
| 25 | 21.63505575 | 0.7713726712 | 57 | 43.69847751 | 0.6270206064 | 89 | 62.25904331 | 0.5418801788 |
| 26 | 22.40030907 | 0.7652533157 | 58 | 44.32220256 | 0.6237250503 | 90 | 62.79879353 | 0.5397502196 |
| 27 | 23.15958677 | 0.7592776958 | 59 | 44.94268357 | 0.6204810062 | 91 | 63.33643874 | 0.5376452135 |
| 28 | 23.91302703 | 0.753440261 | 60 | 45.55997071 | 0.6172871441 | 92 | 63.87200342 | 0.5355646766 |
| 29 | 24.66076279 | 0.7477357595 | 61 | 46.17411289 | 0.6141421827 | 93 | 64.40551156 | 0.5335081385 |
| 30 | 25.4029220 | 0.7421592137 | 62 | 46.78515778 | 0.6110448855 | 94 | 64/9369867 | 0.5314751403 |
| 31 | 26.1396279 | 0.7367059029 | 63 | 47.39315184 | 0.6079940592 | | | |

with a physical elongation of about 7 mils per crimp accounting for about a 0.7% physical elongation of the line for a factor of 0.993; and an additional RC delay produced by the 50 ohm line impedance and the 736 ohm capacitive reactance (each $\frac{1}{2}$ wavelength) results in a phase delay of $\tan^{-1}(50/736)$ or 87.7°. Thus the fre- FIG. 7A illustrates the experimental amplitude response of a crimped cable formed with uniform crimp depth in accordance with the crimp locations indicated in Table I. Note the flatness of the response over the 3.6 GHz passband for this embodiment.

Figure 7B:
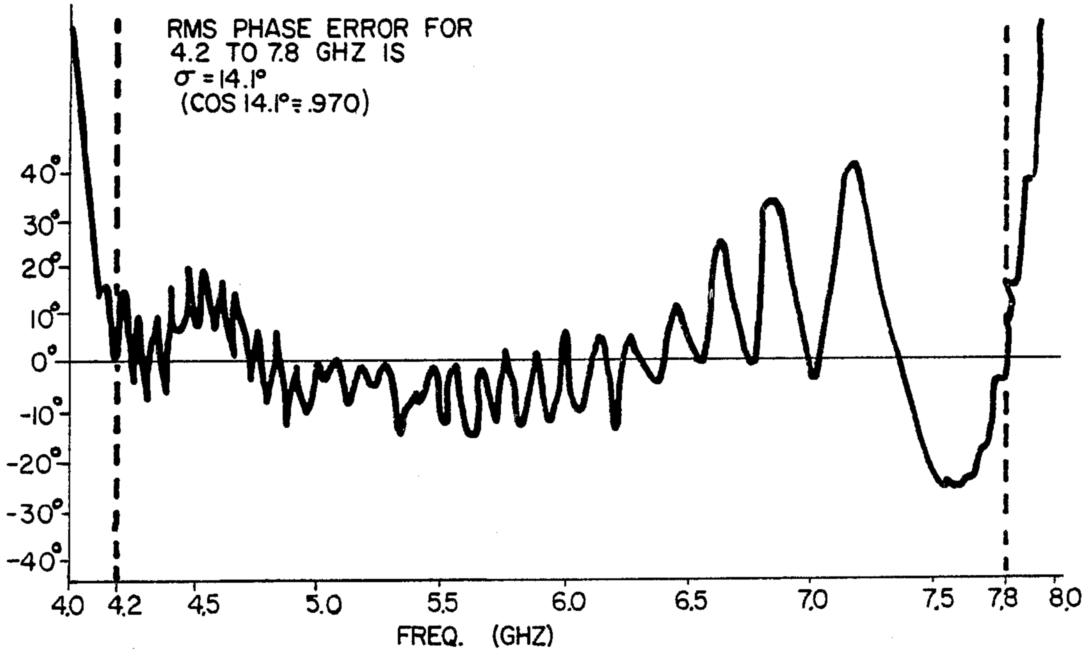

FIG. 7B shows phase deviation for the above experimental line indicating an RMS phase deviation from an ideal quadrature characteristic of 140 which is within 3% of an ideal line

CONSTRUCTION OF THE CRIMPED LINE

While the crimping operation can be accomplished with a conventional rolling wheel tube cutter 60 such as shown in FIG. 8, the crimping can also be accomplished with a conventional four-toothed crimping device 70 such as Model MS 27831 manufactured by the Daniels Manufacturing Company. This crimping device, in one embodiment, was modified by removing the second set of teeth which exist immediately behind the first set of teeth. As can be seen from FIG. 9, a handle portion 72 may be moved in the direction of arrow 74 such that the teeth 76 move in the direction of the arrows 78. The depth of the crimp determines the shunt capacitance as outlined above.

The utilization of standard 85 mil coax and the crimping device results in a crimp of the coaxial line such as shown in cross section in FIG. 10. The crimped portions are indicated by reference character 82 and the uncrimped portion of the outer conductor indicated by reference character 84.

The result as can be seen from FIG. 10 is a truncated, trapezoidal crimp configuration shown at 90 in a portion 92 of a semi-rigid coaxial line.

It is also possible to obtain shunt capacitive reflectors by utilization of any number of crimps or by parallel, straight edges through which the coaxial cable is passed, with the edges brought down to bear on opposite sides of the cable.

While the subject invention has been described for use with "semi-rigid" cable, it is, of course, possible to use coaxial cable with braid assuming that the crimped braid is held in place after crimping by a suitable device such as a "C" clamp (not shown).

BIFURCATED DELAY LINE

Figure 11:
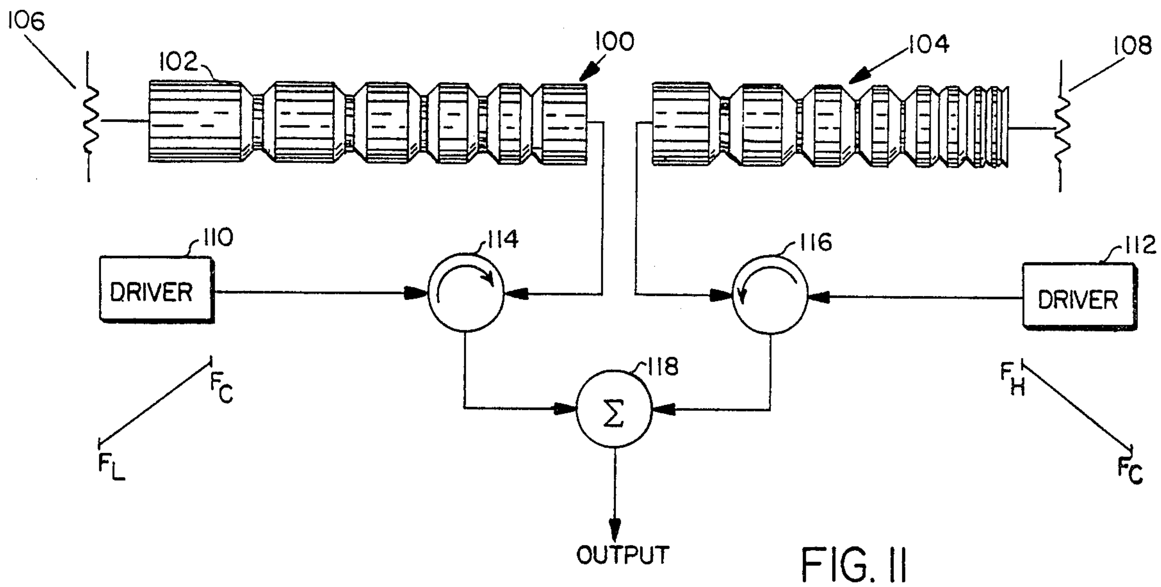
FIG. 11 is a diagram showing a bifurcated line version of the subject invention.

Under ordinary circumstances with a dispersive delay line, in order to reduce the sin x/x sidelobes that would result from uniform frequency response, it is usually necessary to provide weighting which, in essence, reduces the response at the ends of the line, whereas maximum response in maintained at the center of the line. The center of the line represents the center frequency of the line and therefore, there should be very little weighting, if any at all, at this center frequency. However, when feeding the line from one end, one has half the line loss at this center point. The purpose of bifurcating, therefore, is to feed the line at the center where the weighting is to be least and the insertion loss is least. This results in an overall lower line insertion loss, taking into account that it is desirable to build in loss as one proceeds in either direction from the center of the line. A bifurcated line is illustrated in FIG. 11, in which the line 100 is cut in half such that the lower frequency section 102 is to the left and the higher frequency section 104 is to the right. As will be seen both sections are terminated conventionally at 106 and 108 respectively.

In order to drive this line, it is necessary to have two drive units, here illustrated at 110 and 112 respectively. The first drive unit is coupled through a circulator 114 to the right hand end of section 102 whereas the second drive unit is coupled through a circulator 116 to the left hand end of section 104. The output of circulator 114 is coupled to an adder 118 which adds this output with the output from circulator 116.

In essence, the drive units are such that drive unit 110 sweeps between the lowest frequency $f_L$ and the center frequency $f_C$ whereas the right hand drive unit 112 simultaneously sweeps from the upper frequency $f_H$ down to the center frequency $f_C$.

In operation, the left hand side of the line is swept from $f_L$ to $f_C$. The output of this section of the line results in a signal representing $f_L$ emerging at approximately the same time as the signal at $f_C$ which occurs at the end of the sweep. With respect to the right hand section of the line, a signal at $f_H$ is first introduced into this line with the signal decreasing in frequency to $f_C$. The result is that $f_C$ emerges at the same time that $f_C$ appears at the output for the left hand side of the line, namely at the end of the sweep of either of the drive units. This results in a compressed pulse with proper weighting but with lower insertion loss.

Not only is there lower insertion loss, but the time for generating the compressed pulse is divided in half. This means that it takes only half the time to fill both lines when driven in parallel. The result is that each reflective signal in a section comes back in half the time, and therefore, the compressed pulse can be produced in half the time.

In terms of a compressive receiver, this means that the bifurcated compressive receiver may operate at twice the speed of a conventional compressive receiver in that it may be swept twice as fast. Alternatively, the bandwidth of the compressive receiver can be increased when operating at a normal sweep rate.

Figure 12:
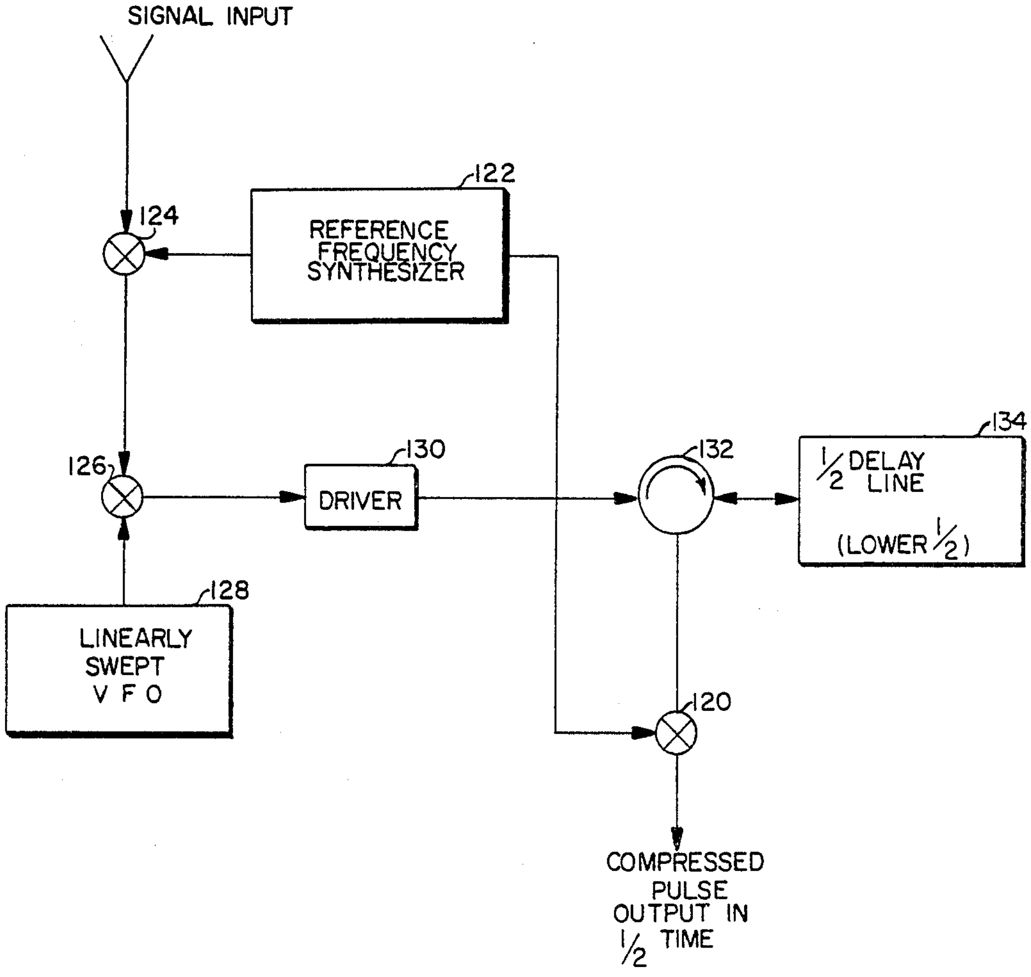
FIG. 12 is a diagram showing the use of only a portion of the delay line of FIG. 10.

Ordinarily, there is a tradeoff between the rapidity at which a compressive receiver may be swept and the bandwidth of the dispersive delay line. However, it is possible to duplicate the results obtained by the apparatus of FIG. 11 utilizing only one-half of the delay line. The result, as well be seen in FIG. 12, is that not only is the compressed pulse produced in half the time, but also the bandwidth is increased simultaneously. This presents an extraordinary advantage when the subject delay line is utilized with compressive receivers.

Referring now to FIG. 12, it has been found that it is, in fact, only necessary to utilize one-half of the delay line described in FIG. 11. The second half of the compressed pulse is formed by a frequency conversion mixer 120 which is driven by a reference frequency synthesizer 122 at a frequency $2f_o$, where $f_o$ is the center frequency of the line. Thus, as shown in FIG. 12, an input signal may be mixed at a mixer 124 with a base band converting signal from the reference frequency synthesizer, the output of which is applied to a second mixer 126. Note—if frequency conversion is not desired mixer 124 may be eliminated. The other input to mixer 126 is the output from the linearly swept, voltage controlled oscillator 128. The output of mixer 126 then feeds driver 130 coupled to a circulator 132 which drives one-half the delay line 134. This half in this case is the same as section 102 in FIG. 11. The output of circulator 132 is then mixed at mixer 120 so as to simulate the same output as would be derived at adder 118 of FIG. 11.

It will be appreciated that by suitable baseband transformation, it is possible to shift the center frequency of the one-half section of the delay line to the appropriate lower center frequency, thereby obtaining an additional decrease in loss with a concomitant production of the compression pulse in one-half the time.

An obvious advantage of this approach is that it is necessary to utilize only one driver and one-half of the usual delay line.

One way of visualizing the operation of the bifurcated delay line of FIG. 11 is now set forth in terms of a typical microscan receiver with a basic signal bandwidth of 1.0 GHz; a scan rate of 1 GHz/100 nanoseconds; signal-frequency resolution of ±7.5 MHz, and unity probability of full compressive processing of all signals with width greater than 200 nanoseconds.

The base line approach described above is based on a reflective dispersive delay line formed from small diameter, semi-rigid coax, the goal of which is to provide improved detectibility of shorter pulses, e.g. in the 100 nanosecond range. The single port nature of the crimped coax dispersive delay line is detrimental to a minimum of propagation attenuation in the line, since there is no natural isolation of the output of the simultaneously present input. Propagation loss is in effect eliminated by bifurcating the delay line at the centrally located mid-band point, and feeding the two halves simultaneously with an upswept signal and the other with a downswept signal. While in FIG. 11 dividing the swept driving signal into two halves was described, it will be appreciated that one can simulate the upper half by deriving a downswept signal as an image signal.

As a result, an output/input ratio greater than 40 dB is achieved, and the delay line fill time is halved. As mentioned above, it is found that one-half of the bifurcated line can be completely eliminated by frequency inverting the output of the other half. The half time, furthermore, operates at lower frequencies than before.

The shorter frequency scan makes it additionally practical to use the crimped coax dispersive delay line for generating a swept local oscillator signal. Low transmission losses allow increasing the bandwidth of the compressive line and the swept LO range to further shorten the receive cycle time.

One choice of tradeoffs results in a receiver with a 75.0 nanosecond cycle time and a 1.0 GHz signal bandwidth that has unity probability of intercept for pulses of 125 nanosecond width. The compressive line occupies 5.0 cubic inches, while the swept-LO crimped coax line would occupy about 7.0 cubic inches and have only 22.0 dB maximum transmission attenuation. Another choice would be not to bifurcate the line, but to quadfurcate the line utilizing a four-segment compressive filter, which would reduce the cycle time to 50 nanoseconds, and the 100 percent intercept pulsewidth decreases to 75 nanoseconds.

By way of comparison to a single length dispersive line operated over a single bandwidth of $f_{max}-f_{min}$, exactly equal to the full compression-filter bandwidth, $\Delta f$, the time to linearly sweep $\Delta f$ is indicated as $\Delta\tau$. It can be shown that line fill time for any CW signal between $f_{max}$ and $f_{min}$ is $\Delta\tau$ in order to cover the full signal bandwidth.

In a single line at the midpoint it is desirable to have a maximum response, e.g. at the center frequency of the line. However there is a substantial line loss at this midpoint. By bifurcating the line and feeding at the midpoint this transmission loss is eliminated.

To simultaneously fill both halves of the bifurcated line, it is necessary to upsweep one section from the lower band edge, $f_0-\frac{1}{2}\Delta f$, to the center frequency, $f_o$, and downsweep the other section from the upper band edge, $f_o+\frac{1}{2}\Delta f$, to the center frequency. As mentioned hereinbefore, the two line-section outputs are summed to fom the composite compressed-pulse output. As can be seen, an advantage is obtained in this way, i.e., for the same sweep rate as that used in a single-length line, $\Delta f/\Delta\tau$, the bifurcated line is filled in one-half the time, $\Delta\tau/2$. A signal at the maximum frequency $f_{max}$, therefore, emerges as a compressed pulse only $\Delta\tau/2$ after commencing a scan, and a signal at the minimum frequency, $f_{min}$, emerges at a time $\Delta\tau$ thereafter.

The bifurcated line is seen to require a total frequency-sweep range of only 3/2 $\Delta f$, and a total two-way sweep-generation line of only 3/2 $\Delta\tau$ in length. Both the reduced sweep range and line length work to result in a lower attenuation for the sweep requirement of $2\Delta f$ down to $3/2\Delta f$. In the countersweeping signal case, $\Delta f$ in one operative example equaled 1 GHz, $\Delta\tau$ equaled 100 nanoseconds, bandsweep equaled 1.0 GHz.

As can be seen, by bifurcating the line, 100 nanoseconds pulses can be fully processed with unity probability.

Half-Line Embodiment Explanation

In the example above, it was assumed that $f_o 3/2\Delta f$. Noting that the upswept half of the line only runs from $f_o \frac{1}{2}\Delta f$ to $f_o$, it is possible to set $f_o=\Delta f$, running the input sweep from $\frac{1}{2}\Delta f$ to $\Delta f$, thus lowering the highest frequency processed by one-third. The downswept half of the line can by the same token be run from 3/2 $\Delta f$ down to $\Delta f$, but this may also be improved to run the same range as the upswept half, i.e., $\Delta f$ down to $\frac{1}{2}\Delta f$, if the compressed output is then frequency-translated upward by $\frac{1}{2}\Delta f$ prior to summing with the compressed output of the upswept half of the line.

Once having recognized this, as described in FIG. 12, it is entirely possible to eliminate the downswept half of the line by mixing the compressed-pulse output of the upswept half of the line with a fixed local oscillator signal at 2 $f_o$. The difference frequency output is then also centered at $f_o$ but with an inverted spectrum, and so can be used as the equivalent of the output of the downswept half of the line.

With a single half-length line used in the upswept mode it is easy to increase the bandwidth of the line in the interest of reducing the total sweep cycle time and to reduce the minimum length of signal pulse that is fully processed with unity-intercept probability. This can result for example, in a receiver having an effective $\Delta\tau=100$ nanoseconds, an effective line length of 2.0 GHz, a signal-sweep bandwidth of 1.0 GHz, and a total cycle time of 100 nanoseconds, assuming negligible sweep reset time and an octave bandwidth. This embodiment would fully process a 150 nanosecond pulse with unity intercept probability and 10 MHz resolution. Note that although the linearly swept VF0 128 must produce a broader full sweep, i.e., from 4.0 down to 2.0 GHz, it is only of 100 nanoseconds round trip length, and so has a maximum transmission attenuation (at the 2.0 GHz end) of only 20 dB using 85-mil cable. The one-half bifurcated line embodiment used for compression has, of course, zero transmission loss at center frequency, $f_o=2$ GHz; and 6.5 dB loss at the lower band edge, 1.0 GHz, which results in less than 6 dB required for $\cos^2$ weighting.

It will be appreciated that, in addition to dividing the line into one-half of its originally calculated length, the subject line may be divided into four or any number of parts with appropriate frequency shifting producing a line with extremely low loss. This also produces the compressed pulse in a time divided by the number of times that this line is in fact divided. However, this cannot go on indefinitely. This is because there is a residual signal which is harmless at bifurcation or even quadfurcation, but which becomes significant as the line is broken up into smaller and smaller segments. The technique os bifurcation or quadfurcation is important in the provision of compressive receivers which can sweep a given band at greater rates than are currently possible. Concomitantly, the bandwidth of the line is increased and insertion loss is minimized. By utilization of the bifurcation technique, one can thus obtain simultaneously an increase in bandwidth of the line, an increase in sweep speed of the compressive receiver and a decrease in insertion loss.

HIGH DYNAMIC RANGE EMBODIMENT

It will be appreciated that when utilizing reflective lines, there is some loss of dynamic range in view of the inability to completely isolate the input to the line from the output. Also the better the isolator, the larger and more expensive it tends to be. This results in leakage of the input signal into the output signal. Dynamic range as utilized herein is the ratio of the amplitude of the compressed pulse output to the simultaneous input to a single port device. This contributes to the background noise, such that if a 50 dB dynamic range is desired, only 35 dB may be achievable due to the input signal leakage.

In order to eliminate leakage, in the high dynamic range embodiment, it is necessary to arrange that there is no signal input at the time that the output signal is being read out from the delay line. In order to accomplish this, a dispersive delay line is provided with a non-dispersive segment at the input end of the line so as to enable the readout of the compressed pulse after the input signal is switched off. As an example, assuming that it is desirable to sweep a 1 GHz band in 100 nanoseconds, this means that the FM sweep will take 100 nanoseconds and that the dispersive delay line is designed such that it is filled at 100 nanoseconds. The entire processing time is therefore the sweep time plus the fill time or 200 nanoseconds in order to cover the entire 1 GHz base band sweep. With the use of a 50 nanosecond non-dispersive delay, and therefore a total non-dispersive delay of 100 nanoseconds, the cycle time i.e. the time between sweeps of the compressive receiver, is extended by that 100 nanoseconds. During this 100 nanosecond time period the compressed pulse output can be read out since the input signals are switched off after 200 nanoseconds. This gives a cycle time for the compressive receiver of 300 nanoseconds.

Assuming that at a time $T_o$ there is 100 nanoseconds of signal at the low frequency end of the base band, this signal travels through 50 nanoseconds of the non-dispersive line, is then processed in 100 nanoseconds by its roundtrip through the dispersive line, and is again delayed 50 nanoseconds through the non-dispersive line. Thus, the compressed pulse arrives at the output at the 200 nanosecond mark. For a signal at the high frequency end of base band, this signal will arrive at the input to the 50 nanosecond non-dispersive element at the 100 nanosecond mark because it is sensed at the end of the sweep of the compressive receiver. Thereafter it is delayed 50 nanoseconds by the non-dispersive line and arrives back at the non-dispersive line 100 nanoseconds thereafter, where it is again delayed by another 50 nanoseconds. The high frequency compressed pulse therefore arrives at the output at the 300 nanosecond mark.

The input to the delay line is interrupted for 100 nanoseconds at the 200 nanosecond mark, thereby allowing the compressed pulses to appear at the output of the combined delay lines at some time between the 200 nanosecond mark and the 300 nanosecond mark, depending on the frequency of the incoming signal. It will be appreciated that with the interruption of the input signal at the 200 nanosecond mark, any outputs will be free of input signal leakage.

What has been assumed in the above example is that the lowest frequency input signal exists at time $T_o$ and lasts for a duration of 200 nanoseconds. A 200 nanosecond duration is desirable to be able to sweep through the entire base band. If the lowest frequency signal starts at some time after $T_o$, then there will be incomplete processing in the receiver cycle because the dispersive delay line will have not filled completely. The signal duration must, therefore, extend long enough to be fully processed by the next receiver cycle. In the above example, in order to obtain full processing, it is necessary that the signal duration be at least 400 nanoseconds. What, in fact, occurs is that if the start of a given signal is delayed from $T_o$, the portion of the signal which enters the system between $T_o$ and 200 nanoseconds is in effect not utilized. The existence of this late starting signal will be picked up on the second receiver cycle in view of the fact that there will be at least 200 more nanoseconds of input signal for complete processing in the second cycle. This explanation is true not only for the lowest frequency signal in the base band, but applies equally to the highest frequency signal and all intermediate frequency signals.

It will be appreciated that for insufficiently processed signals, i.e., those that start later than $T_o$, for the first receiver cycle, there will, in fact, be an output for that cycle, but the amplitude of the compressed pulse will be decreased, and pulse shaping will be comprised because the input signal will have been cut off prior to the generation of a complete compressed pulse. This problem is overcome for a 400 nanosecond duration signal because of the complete processing which occurs on the second receiver cycle. Post detection signal-sorting processing can be used to discard the partially-processed output, or width-sensing circuits can be set to ignore compressed pulses of excessive width due to partial processing.

As will be seen in the following example, faster receiver sweep speeds, combined with larger-bandwidth compressive delay lines will reduce the cycle time of the receiver and therefore the signal duration required for complete processing. In addition, paralleling and staggering compressive delay lines and therefore multiply sampling a given signal further reduces the maximum required signal duration.

Figure 13:
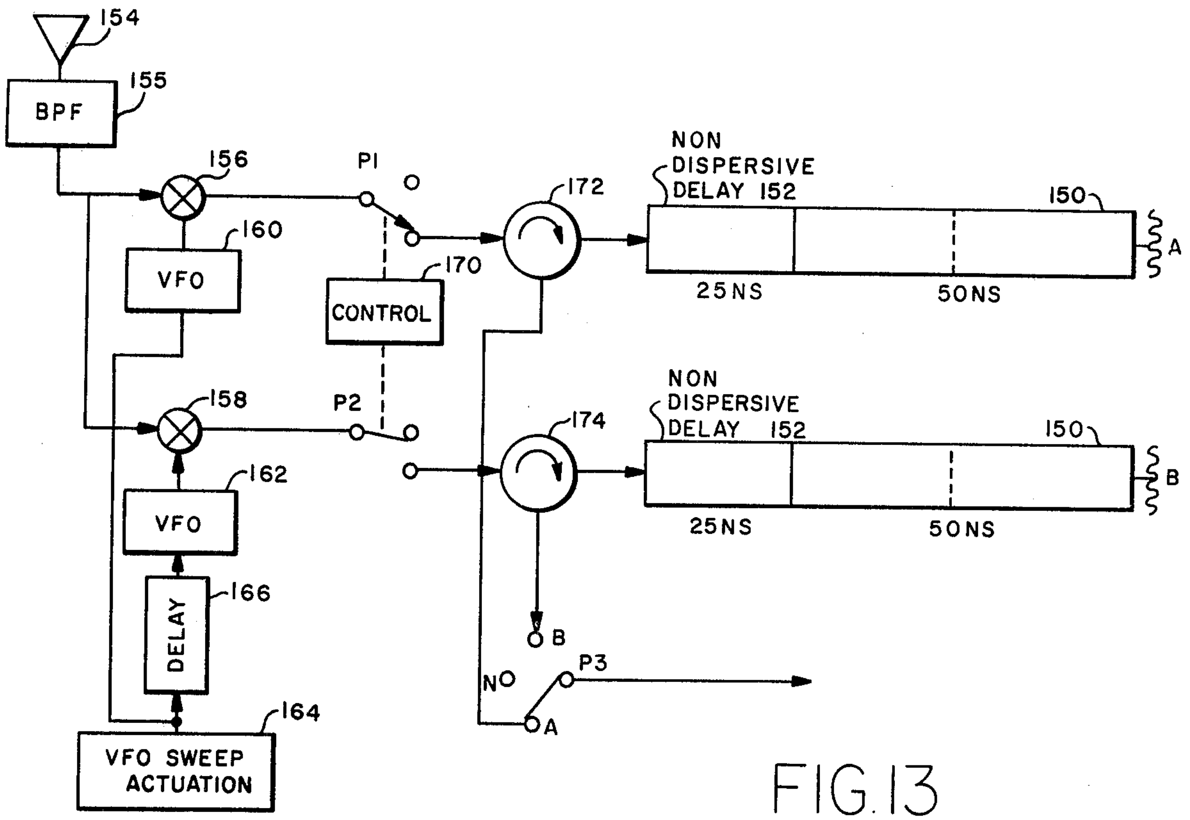
FIG. 13 is a diagram of a two-line embodiment for increasing dynamic range.
Figure 13A:
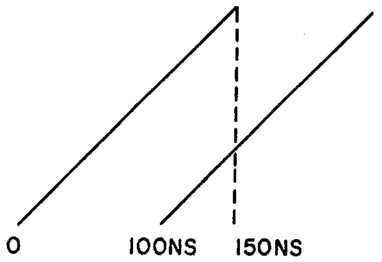
FIG. 13A is a timing diagram.

In one embodiment, as illustrated in FIG. 13, FIG. 13A utilizing a pair of 50 nanosecond compressive delay lines 150, each with a fill time of 100 nanoseconds and a sweeprate of 2 GHz per 100 nanoseconds, leakage due to the simultaneous presence of the input signal can be obviated by the provision of a pair of non-dispersive delay lines 152 of 25 nanoseconds between the input to a dispersive delay line and the signal source, again for a baseband coverage of 1 GHz.

The signal source in this case of a two-channel compressive receiver is a common input antenna 154 and band pass filter 155, coupled in parallel to mixers 156 and 158. The input signals at these mixers are heterodyned respectively with a swept signal from VFO 160 and a swept signal from VFO 162. The start of the sweep of VFO 162 is delayed by 100 nanoseconds as illustrated by the linear sweep lines at the left hand bottom side of this FIGURE. Delayed actuation of VFO 162 relative to VFO 160 is accomplished by a conventional VFO actuation circuit 164 which produces a pulse once every 150 nanoseconds. This pulse is delayed at 166 by 100 nanoseconds and applied to actuate VFO 162. The outputs of mixers 156 and 158 are applied respectively to single pole double throw switches $P_1$, and $P_2$ under control of a control unit 170. As illustrated, one output tap of switch $P_1$ is applied to a circulator 172 feeding the A channel delay line unit, whereas one output tap of switch $P_2$ is applied to a circulator 174 feeding the B channel delay line unit.

The outputs of circulators 172 and 174 are applied to a single pole tripple throw switch $P_3$ which selects which of the output channels are to be read out.

Figure 13B:
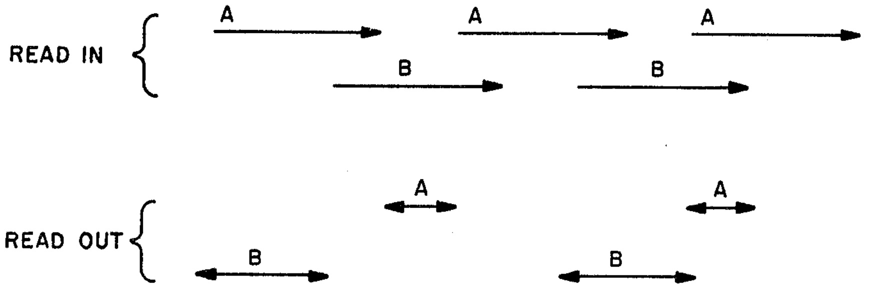
FIG. 13B is a diagram showing when channels A and B are read in and read out.

As illustrated FIG. 13B, channel B is read out while channel A is being read in and vice versa. As can be seen, this is done in a staggered fashion. More importantly channel A is read out upon the interruption of the input to channel A, to give the above mentioned input-/output isolation.

Figure 14:
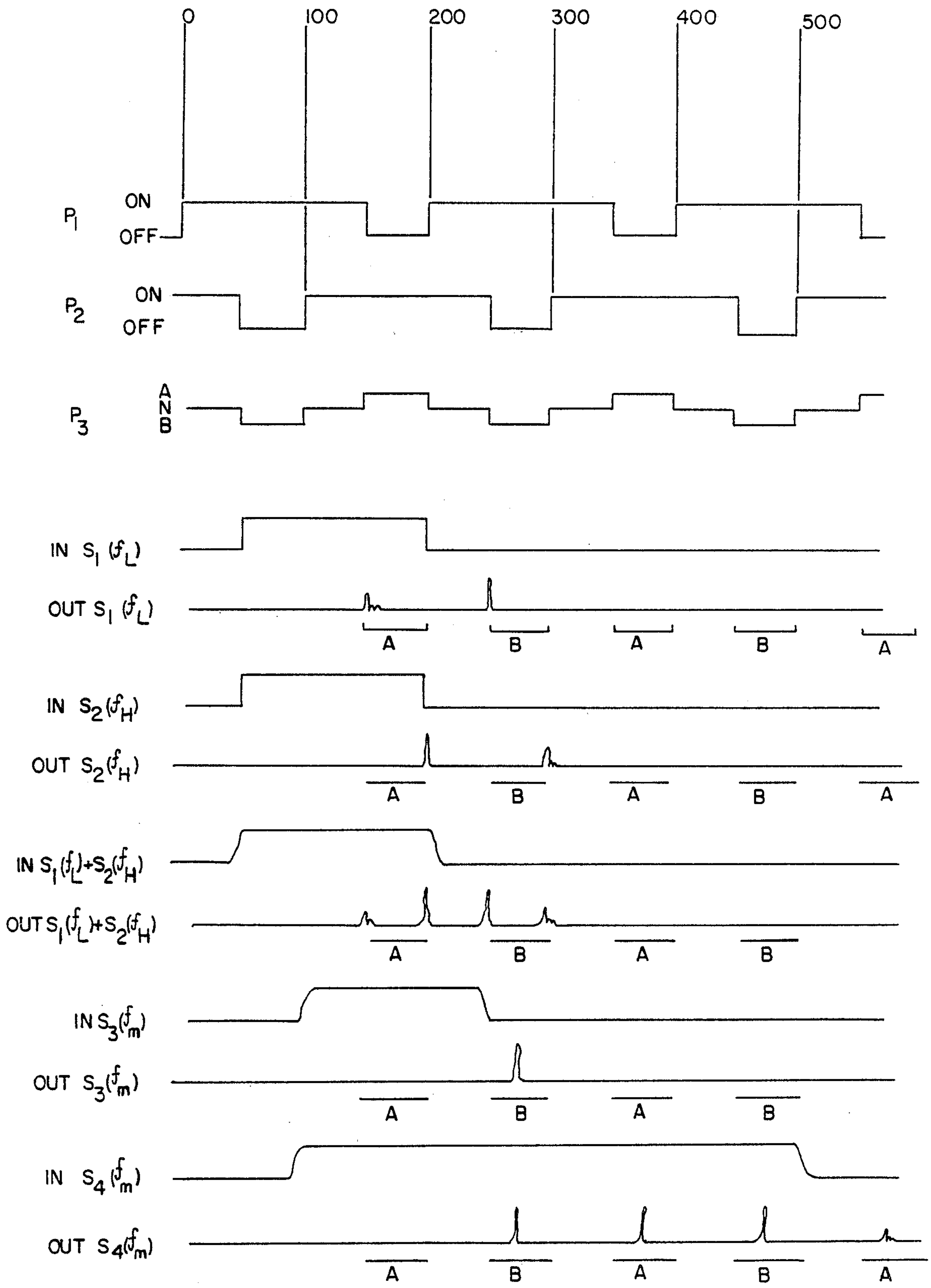
FIG. 14 is a timing diagram for the FIG. 12 embodiment.

The timing diagrams for switches $P_1$, $P_2$ and $P_3$ are given in FIG. 14, along with the expected signal outputs and channel identification. Note while in some cases channels will have compressed pulse signals which have not been fully processed, the widths of these under-processed signals is larger than fully processed signals; this enables distinguishing and eliminating under-processed signals at the receiver output. Or the extraneous signals can be eliminated in post-detection signal-sorting digital processing.

The waveforms designated $P_1$, $P_2$ and $P_3$ indicate the position of the respective switches and provide for the read-in and read-out of input and output data. The remainder of the waveforms indicate signals which start at a time other than $T_o$ and show, in the case of $S_1$, that an incompletely processed compressive pulse exists in the A channel and may be read out with full processing one cycle later in the B channel with 100% probability for signal durations larger than 200 nanoseconds. This is the lowest frequency signal in the base band and it emerges at the beginning of the read-out period. The same situation is shown for an input signal $S_2$ which starts 50 nanoseconds after $T_o$. In this case a fully processed pulse may be read out from the A channel at the end of the first receiver cycle. The situation for $S_1+S_2$ is as illustrated. With respect to signal $S_3$ a midfrequency signal is indicated as starting late. As can be seen, this signal will be picked up in the B channel in the second receiver cycle. Finally for the signal $S_4$, this signal is a long duration signal having a frequency in the middle of the band. As can be seen, with long duration signals there exist a sequence of outputs in each channel, and processing the sequence enables a signal-duration measurement.

In operation, to accomplish the isolation between the input and the output signals, it is desirable to switch the swept incoming signal for 150 nanoseconds to this combination of non-dispersive and dispersive delay lines. It will be appreciated that 150 nanoseconds of signal is necessary because with a 100 nanosecond round trip delay for the dispersive delay line, it takes 100 nanoseconds at a frequency to fill the line. In order to cover a useful bandwidth such as that which would correspond to 50 nanoseconds, i.e., 1 GHz of band, it is necessary for the input signal sweep to be increased by 50 nanoseconds over the 100 nanosecond fill time. If the compressive receiver is to sweep 1 GHz at a time, and assuming a 100 nanosecond round trip travel time within the dispersive delay time, then it is necessary that the total non-dispersive delay be 50 nanoseconds.

Once having decided on a 150 nanosecond sweep, the input signal is switched to the non-dispersive/dispersive delay line combination for 150 nanoseconds. Thereafter, the input signal is removed from this combination, and the compressed pulse and/or pulses are read out in the following 50 nanoseconds for the GHz signal bandwidth.

It will be appreciated that in the foregoing example, the sweep rate of the swept input is assumed to be at the rate of 2 GHz per 100 nanoseconds.

It is possible by utilizing two swept receivers and two such delay line combinations to avoid any gaps in the input signal record by providing the second delay line combination and providing that the second delay line be filled in a staggered arrangement with the first delay line so that at no time is an input signal lost.

In order to accomplish this, two channels are provided in which the incoming signal is heterodyned with a swept oscillator signal and in which the swept oscillators are actuated in offset fashion such that in the above example, the second oscillator starts its sweep 100 nanoseconds after the first oscillator has started its sweep. The net result of this arrangement is full processing by one or the other of the two delay lines. The incoming signal can thus have as little as a 200 nanoseconds duration and still be fully processed with 100% probability.

CRIMPED COAXIAL LINE FUNCTIONING AS A BANDPASS FILTER

Figure 15:
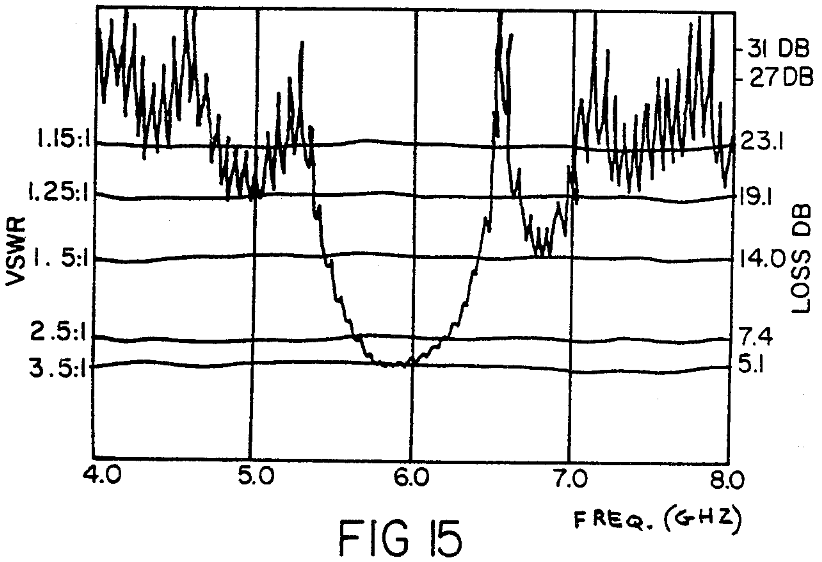
FIG. 15 is a diagram showing a typical filter response when the crimped coaxial cable us configured to function as a bandpass filter.

It will be appreciated that the above improvements have been described in terms of dispersive delay lines in which the delay is a linear function of frequency. The crimped coaxial line may also be configured to function as a bandpass filter. In one embodiment, with equally spaced crimps, the filter has a sin x/x characteristic. Alternatively, with appropriate amplitude weighting, the line can be tailored to a desired bandpass characteristic involving a predetermined sidelobe structure. It will be appreciated that the amplitude weighting is a function of the depth of the crimp. The effect of the depth of the crimp has been hereinbefore described. One typical filter bandpass characteristic for equally spaced crimp case is illustrated in FIG. 15. The line used for the bandpass filter can be bifurcated. Moreover, a non-dispersive section may be added to the bandpass filter so that higher dynamic range may be achieved.

Although preferred embodiments of the invention have been described in considerable detail for illustrative purposes, many modifications will occur to those skilled in the art. It is therefore desired that the protection afforded by Letters Patent be limited only by the true scope of the appended claims.

I claim:

1. A high dynamic range compressive delay line system comprising:
   - means for generating a frequency swept signal suitable for compression by a dispersive delay line;
   - a dispersive delay line terminated at one end and having a single combined input/output port at the other end thereof;
   - a non-dispersive delay line section having an input end, and an output end connected to said dispersive delay line at said single combined input/output port end;

means for interrupting the input to said non-dispersive delay line; and means for applying said frequency swept signal to the input end of said non-dispersive delay line section in timed relation to the sweep of said frequency swept signal such that the application of said frequency swept signal is interrupted by said interrupted means before compressive pulse output signals from said non-dispersive delay line appear at the input end of said non-dispersive delay line section, whereby isolation is established between input and output signals to and from said dispersive delay line.

2. A high dynamic range compressive receiver system utilizing reflective, dispersive delay lines comprising:

a first reflective dispersive delay line, terminated at one end, and having a non-dispersive section at the other end thereof;

first circulator means having three ports, the first of said ports being coupled to the non-dispersive section of said first delay line;

means for generating a number of frequency swept signals such that the sweeps are staggered in time with respect to each other;

first means for heterodyning an incoming signal with one of said frequency swept signals;

a second reflective dispersive delay line terminated at one end and having a non-dispersive section at the other end thereof;

second circulator means having three ports, the first of said ports being coupled to the non-dispersive section of said second delay line;

second means for heterodyning said incoming signal with another of said frequency swept signals;

means for coupling the outputs of said first and second heterodyning means to the second port respectively of said first and second circulator means so as to provide input signals to corresponding said delay lines, and so as to interrupt these input signals prior to the time that output signals from said first reflective delay line appear at the non-dispersive line sections of corresponding delay lines;

means for selectively coupling out signals from the third ports of said circulators at times when output signals from the corresponding delay lines exist at said third ports.

3. Apparatus for providing a compressed pulse output signal corresponding to a predetermined input signal comprising:

means for providing a linearly frequency swept signal;

a reference frequency synthesizer;

means for multiplying the output of said reference frequency synthesizer with said input signal so as to produce a resultant signal;

means for multiplying said resultant signal with said frequency swept signal so as to produce a drive signal;

a reflective dispersive delay line terminated at one end and having an output port, said delay line having a center frequency $f_o$;

circulator means coupled to said drive signal and to said output port, said circulator means having an output port; and means for mixing the signals at the output port of said circulator with signals from said reference frequency synthesizer, said reference frequency synthesizer having an output at $2f_o$.

* * * * *